(12) United States Patent
Minami et al.

(10) Patent No.: US 8,303,723 B2
(45) Date of Patent: Nov. 6, 2012

(54) LIQUID PROCESSING APPARATUS, LIQUID PROCESSING METHOD, AND STORAGE MEDIUM

(75) Inventors: Teruomi Minami, Koshi (JP); Fumihiro Kamimura, Tosu (JP); Kazuki Kosai, Beaverton, OR (US); Takashi Yabuta, Tosu (JP); Kenji Yokomizo, Austin, TX (US); Shogo Mizota, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 306 days.

(21) Appl. No.: 12/634,942

(22) Filed: Dec. 10, 2009

(65) Prior Publication Data
US 2010/0319734 A1 Dec. 23, 2010

(30) Foreign Application Priority Data
Jun. 23, 2009 (JP) .................................. 2009-149033

(51) Int. Cl.
*B08B 3/04* (2006.01)
(52) U.S. Cl. ................ 134/26; 134/18; 134/21; 134/29; 134/33; 134/36; 134/42; 134/902; 438/745; 438/748; 438/749; 438/750; 438/751; 438/906; 216/52; 216/53; 216/83; 216/92; 216/95; 257/E21.228
(58) Field of Classification Search .................. 438/745, 438/748, 749, 750, 751, 906; 216/52, 53, 216/83, 92, 95; 257/E21.228; 134/18, 21, 134/26, 29, 33, 36, 42, 902
See application file for complete search history.

(56) References Cited

U.S. PATENT DOCUMENTS

| 6,846,750 | B1 | 1/2005 | Ohiwa et al. |
|---|---|---|---|
| 7,482,281 | B2 * | 1/2009 | Fujii et al. ................ 438/745 |
| 7,959,820 | B2 | 6/2011 | Hashizume |
| 2004/0002214 | A1 * | 1/2004 | Mizutani et al. ............ 438/689 |
| 2005/0034745 | A1 * | 2/2005 | Bergman et al. ................ 134/26 |
| 2007/0087456 | A1 | 4/2007 | Hashizume |
| 2007/0154636 | A1 | 7/2007 | Hashizume |
| 2008/0053489 | A1 | 3/2008 | Mizota et al. |

(Continued)

FOREIGN PATENT DOCUMENTS
JP 2001-015479 A1 1/2001
(Continued)

OTHER PUBLICATIONS
U.S. Appl. No. 12/320,536.
(Continued)

*Primary Examiner* — Bibi Carrillo
(74) *Attorney, Agent, or Firm* — Burr & Brown

(57) ABSTRACT

In a liquid processing apparatus configured to remove, from a substrate including a first film and a second film formed above the first film, the first film and the second film, a first chemical-liquid supply part supplies, to a substrate W, a first liquid for dissolving the first film, a second chemical-liquid supply part supplies a second chemical liquid for weakening the second film, and a fluid supply part serving also as an impact giving part gives a physical impact to the second film so as to break the second film and supplies a fluid for washing away debris of the broken second film. A control device controls the respective parts such that, after the second liquid has been supplied and then the fluid has been supplied from the fluid supply part, the first chemical liquid is supplied.

11 Claims, 9 Drawing Sheets

U.S. PATENT DOCUMENTS

2009/0241995 A1* 10/2009 Somervell .................. 134/30
2010/0108096 A1 5/2010 Minami et al.
2010/0112728 A1* 5/2010 Korzenski et al. ............ 438/3

FOREIGN PATENT DOCUMENTS

| | | |
|---|---|---|
| JP | 2007-134689 A1 | 5/2007 |
| JP | 2007-180497 A1 | 7/2007 |
| JP | 2008-004878 A1 | 1/2008 |
| JP | 2008-004879 A1 | 1/2008 |
| JP | 2008-060368 A1 | 3/2008 |
| JP | 2008-235341 A1 | 10/2008 |
| JP | 2010-114210 A1 | 5/2010 |
| WO | 2008/030713 A1 | 3/2008 |

OTHER PUBLICATIONS

Japanese Office Action dated Jun. 12, 2012.

* cited by examiner

LIQUID PROCESSING APPARATUS, LIQUID PROCESSING METHOD, AND STORAGE MEDIUM

CROSS REFERENCE TO RELATED APPLICATIONS

This application is based upon and claims the benefit of priority from the prior Japanese Patent Application No. 2009-149033 filed on Jun. 23, 2009, the entire contents of which are incorporated herein by reference.

BACKGROUND OF THE INVENTION

1. Field of the Invention

The present invention relates to a technique for liquid-processing a substrate surface, particularly to a technique for removing a film laminated on the substrate surface.

2. Description of Related Art

In recent years, a wiring connecting device has been further miniaturized in accordance with high integration of a semiconductor device. Thus, a technique, which has been conventionally used for mainly forming a device such as a gate electrode, is applied to a wiring process (BEOL (Back-End-of Line) process). For example, when a via hole is etched in an interlayer dielectric film, the interlayer dielectric film is sometimes coated with an antireflection film for preventing influence caused by a reflected light upon exposure. In addition, there is sometimes formed a mask layer for compensating a thickness of a resist film which is thinned to cope with the miniaturization of a wiring. In this manner, a multiple of films are formed on the film to be patterned (for example, JP2001-15479A).

On the other hand, a so-called low-k material has been employed as a material for an interlayer dielectric film to be etched. The low-k film has a dielectric constant lower than that of conventional $SiO_2$, in order to prevent increase in capacity between wirings in accordance with miniaturization of wirings. A porous material such as SiOCH is used as such a low-k material. As compared with $SiO_2$, the low-k film has lower plasma resistance and lower chemical resistance. Thus, when an antireflection film is removed by a conventional method such as an ashing method using an oxygen plasma, or a releasing method using an SPM (Sulfuric acid-hydrogen Peroxide Mixture) liquid, there is a possibility that the interlayer dielectric film made of the low-k material might be also damaged. Thus, there is required a new removal method that does not damage a basic pattern (low-k material).

As one of the removal methods that does not have a great influence on the low-k material, it is under review to use a chemical liquid in which an amine-based release agent, which has a release performance smaller than that of a conventionally used SPM liquid, is dissolved in an organic solvent. However, since such a chemical liquid may lack ability to dissolve an antireflection film, it can be expected that the method using such a chemical liquid takes more time as compared with the ashing method and the SPM method, to thereby deteriorate a throughput of an apparatus.

SUMMARY OF THE INVENTION

The present invention has been made in view of the above circumstances. The present invention provides a liquid processing apparatus, a liquid processing method, and a storage medium, capable of removing a film from a surface of a substrate with the use of a new method.

In addition, the present invention provides, in the liquid processing apparatus and the liquid processing method that collect a used chemical liquid, prevention of clogging of mechanism, which removes debris of a film from a collected chemical liquid, such as a filter disposed on a downstream side of a chemical-liquid collection line.

An embodiment of the liquid processing apparatus configured to remove a first film and a second film from a substrate including the first film and the second film formed above the first film, the liquid processing apparatus comprising: a substrate holding part configured to hold the substrate; a first chemical-liquid supply part configured to supply, to the substrate, a first chemical liquid for dissolving the first film; a second chemical-liquid supply part configured to supply, to the substrate, a second liquid for weakening a strength of the second film; an impact giving part configured to give a physical impact to the second film; a fluid supply part configured to supply, to the substrate, a fluid for washing away debris of the second film to which the physical impact has been given; and a control device configured to control the respective parts such that, after the second chemical liquid has been supplied to the substrate from the second chemical-liquid supply part and the fluid has been supplied to the substrate from the fluid supply part, the first chemical liquid is supplied to the substrate from the first chemical-liquid supply part.

The liquid processing apparatus may further has one of the following features.

(a) The fluid supply part also serves as the impact giving part that gives the physical impact to the second film by the fluid supplied from the fluid supply part.

(b) The liquid processing apparatus further comprising: a chemical-liquid collection line through which the chemical liquid that has been supplied to the substrate is collected; a discharge line through which the fluid containing the debris of the second film is discharged; and a switching part that switches destinations of the chemical liquid or the fluid that has been supplied to the substrate, between the chemical-liquid collection line and the discharge line; wherein the control device controls the switching part such that the first chemical liquid or the second chemical liquid supplied to the substrate is allowed to flow to the chemical-liquid collection line, and that the fluid containing the debris of the second film is allowed to flow to the discharge line.

(c) The first chemical liquid and the second chemical liquid are formed of the same chemical liquid, and the first chemical-liquid supply part also serves as the second chemical-liquid supply part.

(d) The fluid supply part is formed of a binary fluid spray nozzle that jets a mixed fluid of liquid and gas to a surface of the substrate.

(e) The first chemical liquid includes an amine-based release agent.

An embodiment of the liquid processing method for removing a first film and a second film from a substrate including the first film that is dissolved by a first liquid, and the second film formed above the first film, the second film being less dissolved by the first chemical liquid as compared with the first film, the liquid processing method comprising: supplying a second chemical liquid to the substrate for weakening a strength of the second film; breaking the second film by giving a physical impact to the second film; removing the second film by means of a fluid, by supplying the fluid to the substrate so as to wash away debris of the second film to which the physical impact has been given; and dissolving and removing the first film by supplying the first chemical liquid to the substrate.

An embodiment of the storage medium storing a computer program executable on a computer, which is used in a liquid processing method for removing a first film and a second film from a substrate including the first film that is dissolved by a first liquid, and the second film formed above the first film, the second film being less dissolved by the first chemical liquid as compared with the first film, the liquid processing method comprising: supplying a second chemical liquid to the substrate for weakening a strength of the second film; breaking the second film by giving a physical impact to the second film; removing the second film by means of a fluid, by supplying the fluid to the substrate so as to wash away debris of the second film to which the physical impact has been given; and dissolving and removing the first film by supplying the first chemical liquid to the substrate.

According to the embodiment, the strength of the second film formed above the first film is weakened by supplying the second chemical liquid to the second film. Then, the second film is broken and removed by giving an impact to the surface of the substrate by the fluid. Thereafter, the first film is dissolved by the first chemical liquid so as to be removed. Thus, even when the second film is difficult to be dissolved by the first chemical liquid, for example, the first film and the second film can be removed from the substrate.

DETAILED DESCRIPTION OF THE INVENTION

Figure 1A:
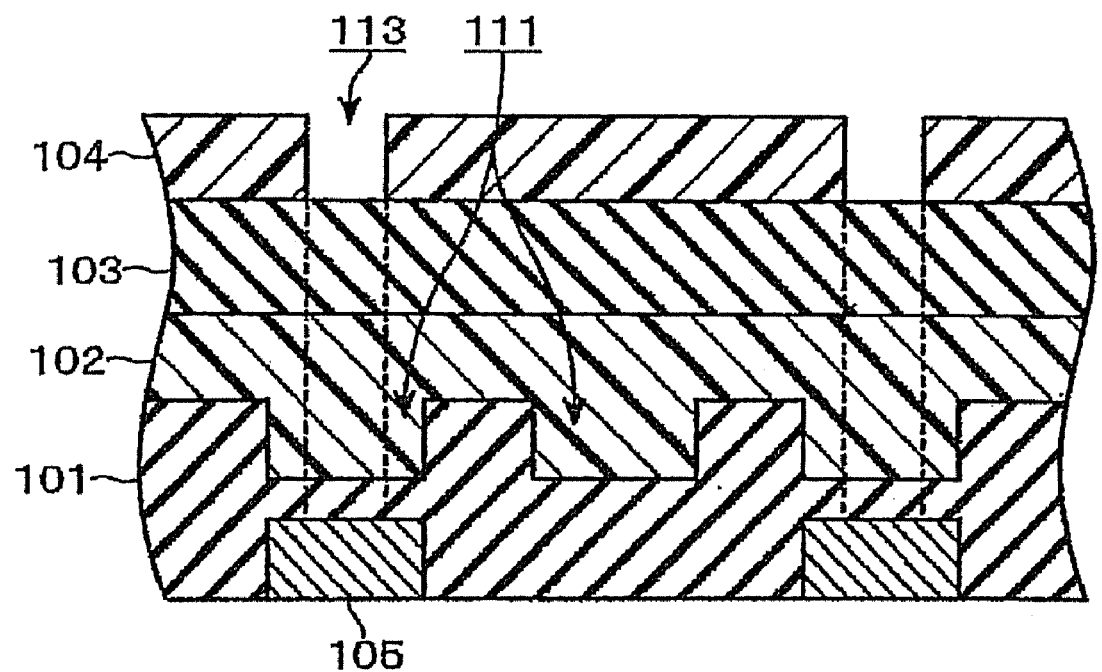
FIGS. 1A and 1B are longitudinal sectional views each showing a structure of a wafer surface to be liquid-processed.
Figure 1B:
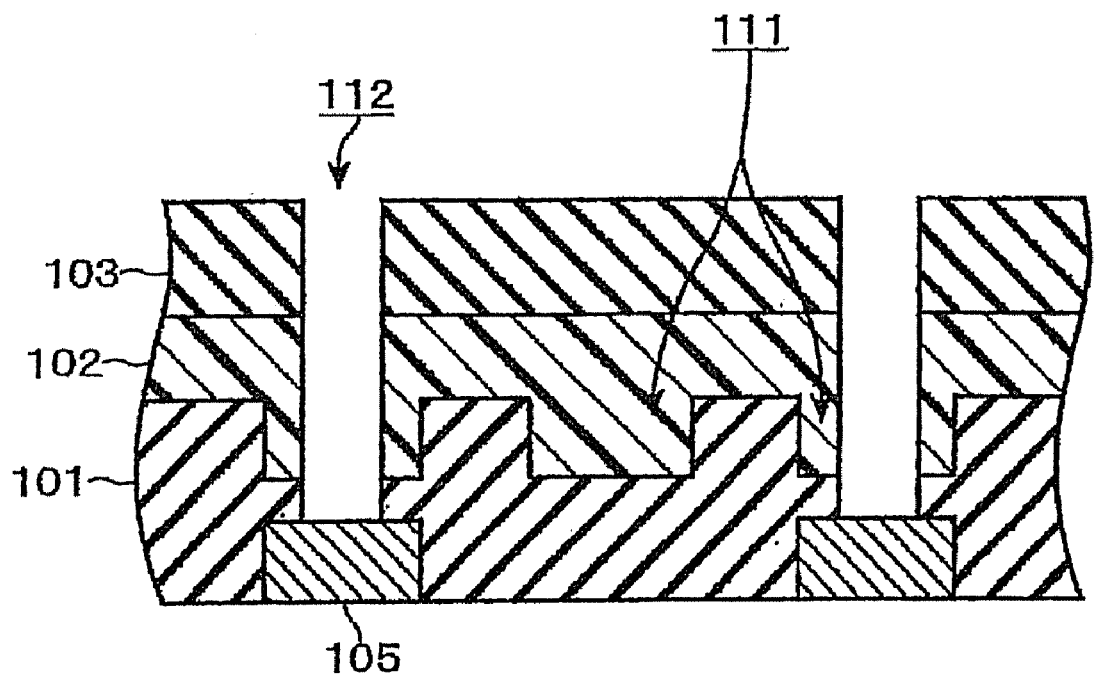

As show in FIG. 1A, there is prepared a wafer W in which a sacrifice film 102 for preventing waving of a resist film 104, and a BARC (Bottom Anti-Reflection Coating) 103 which is a kind of an antireflection film, are laminated in this order on an interlayer dielectric film 101 made of a low-k material, for example. Given herein as an embodiment is a liquid processing apparatus that performs a liquid process in which a via hole 112 is formed by etching, as shown in FIG. 1B, and thereafter the sacrifice film 102 and the BARC 103 remaining on the interlayer dielectric film 101 are removed. In FIGS. 1A and 1B, the reference number 104 depicts the resist film, 113 depicts a via hole pattern formed in the resist film 104, 111 depicts a trench into which a copper wiring is embedded by a damascene method or the like, and 105 depicts a wiring in a lower layer. Herein, the resist film 104 is scraped away by etching. The sacrifice film 102 corresponds to a first film in this embodiment, and the BARC 103 corresponds to a second film in this embodiment.

Figure 2:
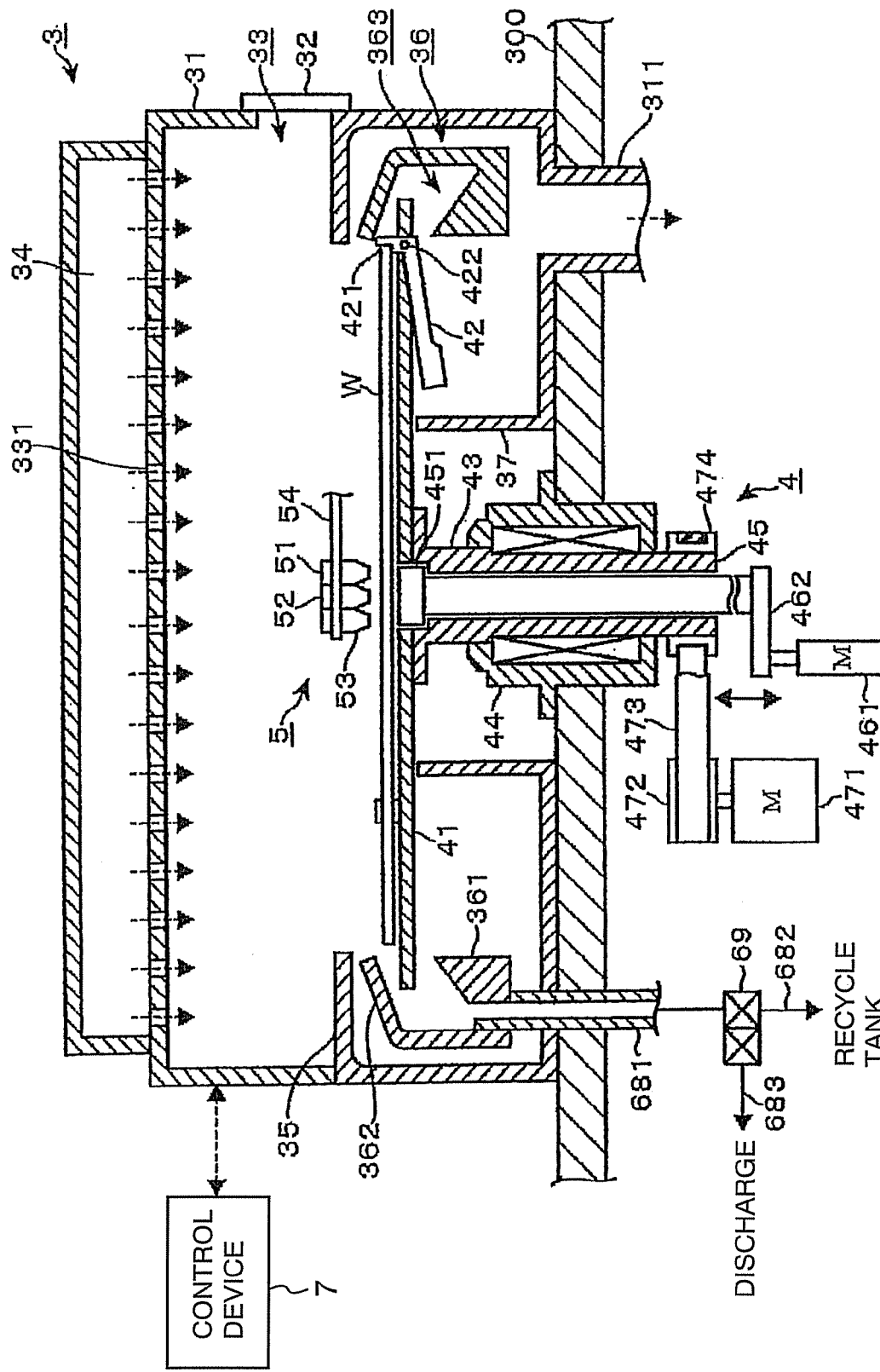
FIG. 2 is a longitudinal sectional view showing a structure of a liquid processing apparatus in this embodiment.

As shown in the longitudinal sectional view shown in FIG. 2, a liquid processing apparatus 3 includes: a wafer holding mechanism 4 configured to rotatably hold a wafer W, a cup member 36 disposed so as to surround the wafer W held by the wafer holding mechanism 4, the cup member 36 being configured to receive a chemical liquid or the like scattered from the wafer W; and a process-liquid supply mechanism 5 configured to supply various process liquids such as chemical liquids onto a surface of the wafer W.

The wafer holding mechanism 4, the cup member 36, and the process-liquid supply mechanism 5 are accommodated in a common housing 31, and the housing 31 is installed on a base plate 300. Disposed on a ceiling part of the housing 31 is an airflow introduction part 34 which is a space into which an airflow from a fan filter unit (FFU) disposed outside is introduced. When an air having flown into the airflow introduction part 34 flows into the housing 31 via a plurality of through-holes 331 formed in the ceiling part of the housing 31, a down flow of purified air flowing downward from above can be formed in the housing 31. The reference number 33 depicts an inlet/outlet port formed in the housing 31, through which a wafer W can be loaded and unloaded, with the wafer W being placed on a pick of an external transfer mechanism. The reference number 32 depicts a shutter for opening and closing the inlet/outlet port 33.

The wafer holding mechanism 4 includes: an under plate 41 of a discoid shape located on a rear side of the wafer W at a position opposed to the wafer W which is held substantially horizontally; a rotational shaft 43 of a cylindrical shape extending vertically downward, the rotational shaft 43 supporting a central part of the under plate 41 from a rear side thereof; and a lifter 45 inserted into the rotational shaft 43 to pass therethrough, the lifter 45 having an upper end thereof capable of projecting to and withdrawing from an opening in the central part of the under plate 41. The wafer holding mechanism 4 corresponds to a substrate holding part in this embodiment.

On a peripheral part of the under plate 41, there are provided a plurality of, e.g., three support pins 42 for supporting a wafer W substantially horizontally above the under plate 41. The support pin 42 is structured as a working piece having, e.g., a lever shape. One end of the support pin 42 is shortly bent, and a cutout portion 421 for supporting an outer periphery of the wafer W from a bottom surface thereof is formed in a distal end of the bent part. As shown in the top plan view of FIG. 3, three cutout portions 411 are formed in the peripheral part of the under plate 41 at equal circumferential intervals therebetween. As shown in FIG. 2, for example, the support pin 42 is received in the cutout portion 411 by a rotational shaft 422, with the aforementioned bent part projecting from an upper surface of the under plate 41.

In this case, when a wafer W is supported by the support pins 42, each support pin 42 is urged such that the bent portion having the cutout portion 421 is inclined outward in a radial direction of the under plate 41. When a wafer W is placed in the cutout portion 421, the whole support pin 42 having a lever shape is pushed downward while rotated about the rotational direction 422, so that the bent part stands upright, whereby the wafer W is substantially horizontally supported so as to be opposed to the upper surface of the under plate 41.

The rotational shaft 43 supporting the under plate 41 from the rear surface thereof is rotatably supported on the base plate 300 through a bearing part 44 incorporating a bearing or the like. A lower end of the rotational shaft 43 projects below the base plate 300. A pulley 474 is disposed on the lower end of the rotational shaft 43. In addition, a rotational motor 471 is arranged on a lateral side of the rotational shaft 43, and a pulley 472 is disposed on a rotational shaft of the rotational motor 471. By winding a drive belt 473 around the two pulleys 472 and 474, a rotational mechanism of the rotational shaft 43 is structured. The rotational shaft 43 is rotated at a desired rotational speed by driving the rotational motor 471, so that the wafer W held by the respective support pins 42 and the under plate 41 can be rotated.

A wafer support part 451 of a flat discoid shape is disposed on the upper end of the lifter 45 inserted in the rotational shaft 43. When the wafer support part 451 is projected from the under plate 41, the wafer W can be supported by the wafer support part 451. On the other hand, a cylinder motor 461 is connected to a lower end of the lifter 45 via an elevation plate 462. The elevation plate 462 and the lifter 45 are moved in an up and down direction, by driving the cylinder motor 461, so that the wafer support part 451 is projected and withdrawn from the upper surface of the under plate 41. Thus, the wafer W can be transferred between the under plate 41 and the pick extending above the support pins 42.

Figure 4:
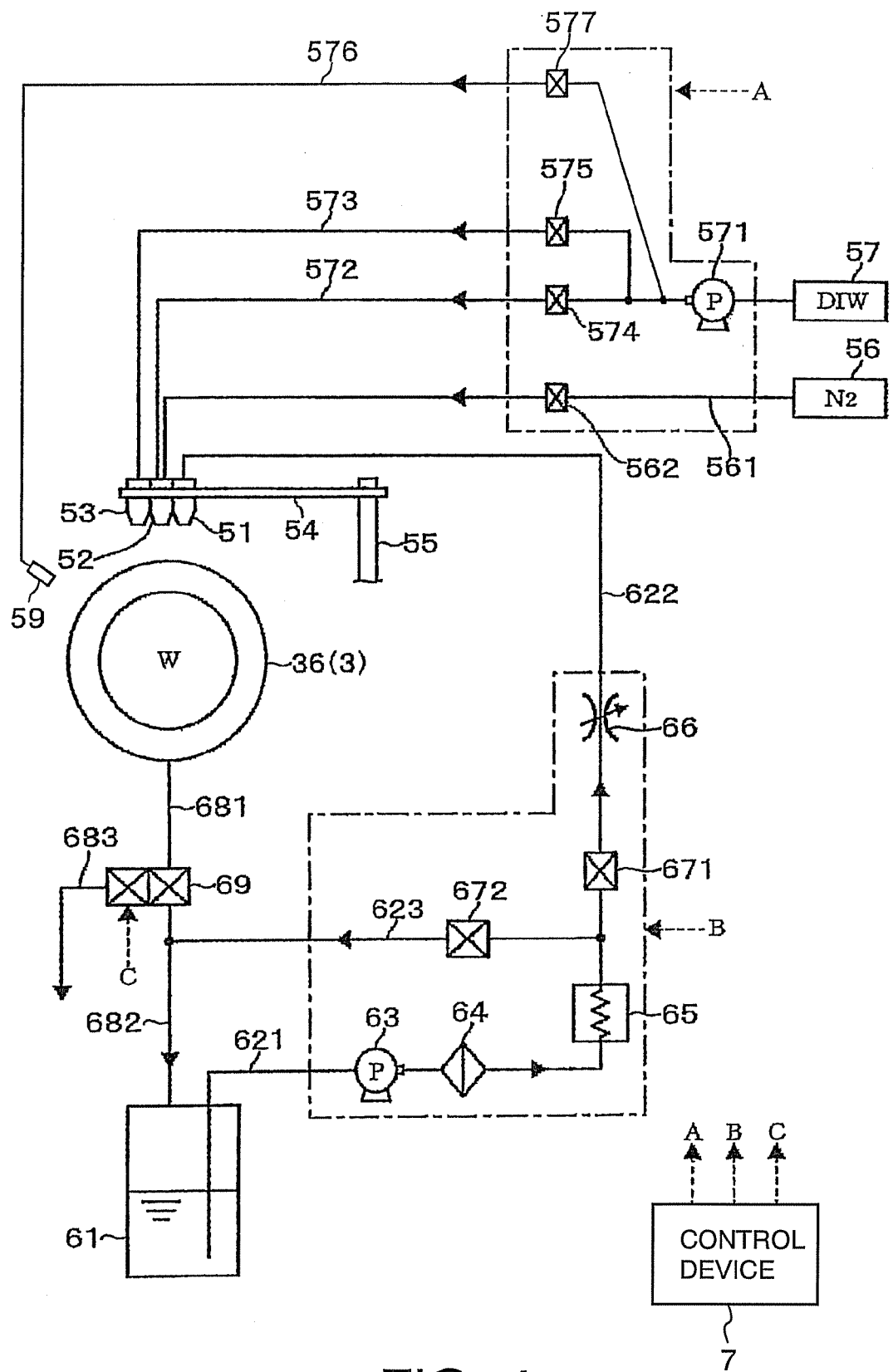
FIG. 4 is an explanatory view showing a supply system and a drainage system of a chemical liquid supplied to and drained from the liquid processing apparatus.

The cup member 36 is a ring-shaped member includes: a cup part 361 having therein a liquid reception space 363 for receiving a liquid such as chemical liquid scattered from a wafer W; and a cover part 362 extending in an inclined manner from an outer sidewall of the cup part 361 toward an upper part of the peripheral portion of the under plate 41, so as to guide a liquid scattered from the wafer W to the liquid reception space 363. The cup member 36 is disposed to surround the under plate 41. A drainage line 681 is connected to a bottom part of the cup member 36, whereby a liquid stored in the liquid reception space 363 can be discharged outside the liquid processing apparatus. As shown in FIG. 4, the drainage line 681 is diverged into a chemical-liquid collection line 682 and a discharge line 683 via a switch valve 69. Thus, a destination of the liquid to be discharged can be switched between a recycle tank 61 connected to the chemical-liquid collection line 682, and an equipment for safety disposal connected to the discharge line 683.

As shown in FIG. 2, an inside wall of the housing 31 accommodating the cup body 36 has a projecting piece 35 that is a ring-shaped plate member extending to a position above the cover part 362 of the cup member 36. A part of the downflow of a purified air flowing inside the housing 31 flows through a gap between the upper surface of the cover part 362 and the lower surface of the projecting piece 35 to reach a space below the under plate 41 via a space between the outer peripheral surface of the cup member 36 and the inside wall surface of the housing 31. The remaining part of the downflow enters the liquid reception space 363 through a gap between the lower surface of the cover part 362 and the upper surface of the under plate 41, and then flows into the space below the under plate 41 through a gap between the inner peripheral wall of the cup part 361 and the lower surface of the under plate 41.

An exhaust duct 311 is connected to the bottom surface of the housing 31. Thus, the airflow flowing to the part space below the under plate 41 can be discharged to, e.g., an equipment for safety disposal, not shown, through the exhaust duct 311. In FIG. 2, the reference number 37 depicts a cylindrical partition wall surrounding the rotational shaft 43 and the bearing part 44, so as to prevent the airflow flowing into the space below the under plate 41 from flowing around the rotational shaft 43.

The liquid processing apparatus 3 as structured above has a function for supplying a chemical liquid for dissolving the sacrifice film 102 onto the surface of the wafer W, and a function for removing the BARC 103, which is difficult to be dissolved by the chemical liquid, by giving thereto a physical (in other words, mechanical) impact to break the BARC 103. Details of these functions will be described herebelow.

Figure 3:
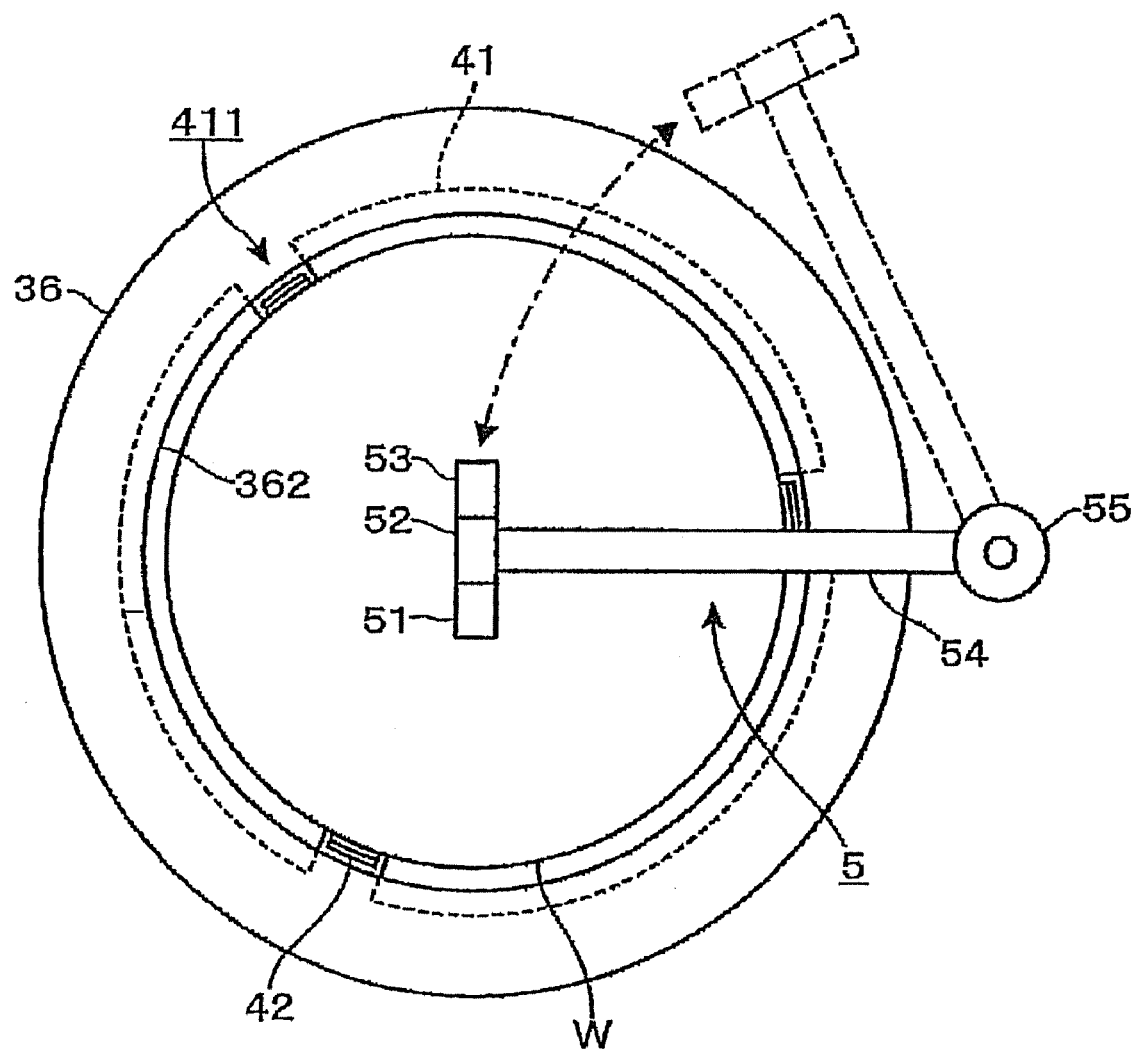
FIG. 3 is a top plan view in which a cup member disposed in the liquid processing apparatus is shown from above.

As shown in the top plan view of FIG. 3, the process-liquid supply mechanism 5 is disposed, for example, on a lateral side of the cup member 36 in the housing 31. The process-liquid supply mechanism 5 includes: a vertically extending rod-like rotational shaft 55; a rod-like arm part 54 that is cantilevered by an upper end of the rotational shaft 55 so as to horizontally extend; and a plurality of, e.g., three nozzles 51 to 53 supported on a distal end of the arm part 54. By turning the arm part 54 about the rotational shaft 55, the nozzles 51 to 53 are moved between a process position at which the nozzles 51 to 53 are located above the wafer W held by the wafer holding mechanism 4, and a retracted position at which the nozzles 51 to 53 are retracted from the process position.

The chemical liquid nozzle 51 corresponds to a first chemical-liquid supply part in this embodiment, and has a function for supplying a first chemical liquid (hereinafter referred to simply as "chemical liquid") for dissolving the sacrifice film 102, to the wafer W held by the wafer holding mechanism 4. As shown in FIG. 4, the chemical liquid nozzle 51 is connected to the above-described recycle tank 61 through a chemical-liquid nozzle line 622 and a chemical-liquid nozzle line 621. Thus, a chemical liquid discharged from the liquid processing apparatus 3 can be reused. The recycle tank 61 stores a chemical liquid in which an amine-based release agent for dissolving, e.g., the sacrifice film 102, and a corrosion protective agent for protecting the interlayer dielectric film 101 made of a low-k material, which is disposed below the sacrifice film 102, are dissolved in an organic solvent. The chemical liquid can remove the sacrifice film 102, almost without damaging the low-k material.

In addition, the aforementioned chemical liquid is less capable of dissolving the BARC 103 as compared with the sacrifice film 102. Thus, it takes a long time to remove the BARC 103 by the chemical liquid only. However, the chemical liquid has the following function. Namely, when the chemical liquid is supplied onto the surface of the BARC 103, the chemical liquid can gradually permeate the BARC 103 and swell the BARC 103, to thereby weaken a mechanical strength of the BARC 103. From this point of view, the chemical liquid also serves as a second chemical liquid, whereby it can be said that the chemical liquid nozzle 51 is also used as a second chemical-liquid supply part in this embodiment for supplying the second liquid to the wafer W.

In FIG. 4, the reference number 63 on the chemical-liquid supply line 621 depicts a pump for feeding the chemical liquid toward the chemical liquid nozzle 51. The reference number 64 depicts a filter for removing foreign matters flowing into the recycle tank 61. The reference number 65 depicts a heater for adjusting a temperature of the chemical liquid. The reference number 671 on the chemical-liquid nozzle line 622 is an opening/closing valve. The reference number 66 depicts a flow-rate regulating valve. The chemical-liquid supply line 621 is diverged, on a downstream side of the heater 65, into the chemical-liquid nozzle line 622 and a bypass line 623. The bypass line 623 is connected to the chemical-liquid collection line 682, so that the circulated chemical liquid can bypass the liquid processing apparatus 3. The reference number 672 on the bypass line 623 depict an opening/closing valve.

For example, the pump 63 is constantly operated in order to avoid frequent switching of the pump 63. Under this state, the bypass line 623 is used for the following purpose. Namely, when the chemical liquid is not supplied to the chemical liquid nozzle 51, the opening/closing valve 671 of the chemical-liquid nozzle line 622 is closed and the opening/closing valve 672 of the bypass line 623 is opened, such that the circulated chemical liquid bypasses the chemical liquid nozzle 51. Meanwhile, in order to supply the chemical liquid to the chemical liquid nozzle 51, the opening/closing valve 671 is opened and the opening/closing valve 672 is closed.

The binary fluid spray nozzle 52 corresponds to an impact giving part and a fluid supply part in this embodiment. The binary fluid spray nozzle 52 has both a function for giving physical impacts to the BARC 103, which has swelled by the supplied chemical liquid and has a weakened mechanical strength, so as to break the BARC 103, by blowing a mixed fluid of deionized water (hereinafter referred to as "DIW") and nitrogen gas onto the surface of the wafer W, and a function for removing the BARC 103 by washing away debris of the broken BARC 103.

Figure 5:
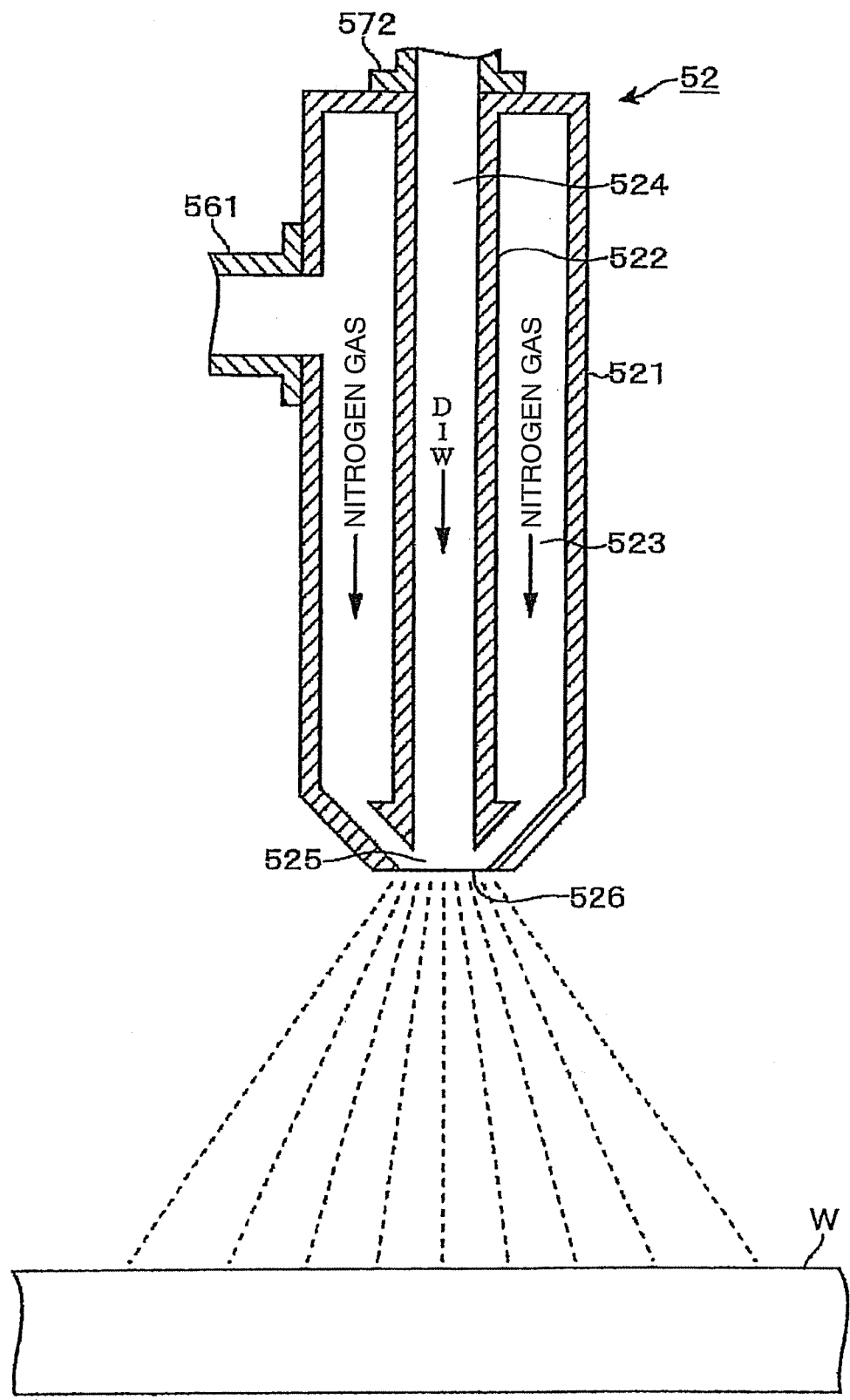
FIG. 5 is a longitudinal sectional view showing a structure of a binary fluid spray nozzle disposed on the liquid processing apparatus.

As shown in FIG. 5, for example, the chemical liquid nozzle 51 has a dual tube structure in which an inner tube 522 is disposed in a cylindrical nozzle body 521 in the vertical axis direction. Namely, for example, a DIW flows through the inner tube 522 and a nitrogen gas flows through a cylindrical gas passage 523 between the inner tube 522 and the nozzle body 521. Then, the flows of the DIW and the nitrogen gas reach an air-liquid mixture area 525 defined in a distal end of the chemical liquid nozzle 51. The DIW and the nitrogen gas are well mixed in the air-liquid mixture area 525, so that the DIW is crashed into fine misty droplets by a shearing force caused by the nitrogen gas. Then, a mixed fluid containing a number of misty droplets are discharged from a discharge opening 526 disposed directly below the air-liquid mixture area 525 toward the surface of the wafer W.

As shown in FIG. 4, the inner tube 522 of the binary fluid spray nozzle 52 is connected to a DIW supply source 57 through a spray nozzle line 572. The reference number 571 on the spray nozzle line 572 depicts a pump, and the reference number 574 depicts an opening/closing valve. On the other hand, the nozzle body 521 is connected to a nitrogen-gas supply source 56 formed of, e.g., a nitrogen gas container, through a nitrogen-gas supply line 561. The reference number 562 on the nitrogen-gas supply line 561 depicts an opening/closing valve.

The rinse nozzle 53, which is one of the nozzles disposed on the process-liquid supply mechanism 5, has a function for supplying a cleaning liquid such as DIW onto the surface of the wafer W. The rinse nozzle 53 is connected to the DIW supply source 57 through a rinse nozzle line 573 which is diverged from the spray nozzle line 572. The reference number 575 on the rinse nozzle line 573 depict an opening/closing valve. In this embodiment, the chemical liquid nozzle 51 and the rinse nozzle 53 are separated from each other. However, the binary fluid spray nozzle 52 may also serve as the rinse nozzle 53. In this case, the supplying operations can be switched as follows. Namely, in a step for removing the BARC 103, a nitrogen gas and a DIW are simultaneously supplied to the binary fluid spray nozzle 52. Meanwhile, in a rinse cleaning step, only a DIW is supplied to the binary fluid spray nozzle 52. The recycle tank 61, the pump 63, the nitrogen-gas supply source 56, and the DIW supply source 57, which are shown in FIG. 4, are disposed in an external chemical-liquid storage unit.

As shown in FIGS. 2 and 4, the liquid processing apparatus 3 is equipped with a control device 7. The control device 7 is formed of a computer including, for example, a CPU and a storage part, not shown. The storage part stores a program including a step (command) group for an operation of the liquid processing apparatus 3, i.e., a control operation of the liquid processing apparatus 3 that loads a wafer W thereinto, removes the sacrifice film 102 and the BARC 103 from the wafer W, and unloads the wafer W. The program, which is stored in a storage medium such as a hard disc, a compact disc, a magnetoptical disc, and a memory card, is installed in the computer. The control device 7 is disposed on an outside mechanical control unit, for example. In this embodiment, there is provided a storage medium for use in a liquid processing apparatus performed by the liquid processing apparatus 3, the storage medium storing a computer program executable on a computer.

An operation of the liquid processing apparatus 3 in this embodiment as structured above is described. The liquid processing apparatus 3 opens the shutter 32 of the housing 31, and waits with the wafer support part 451 of the lifter 45 projecting from the under plate 41. Then, the not-shown pick of the external transfer mechanism, which holds a wafer W, comes to a position above the wafer support part 451. Then, for example, the pick is lowered so that the pick and the wafer support part 451 cross each other, so that the wafer W is delivered to the wafer support part 451. Then, the pick is retracted outside the housing 31, and the shutter 32 is closed. On the other hand, the wafer support part 451 is withdrawn into the rotational shaft 43, whereby the wafer W is held on the support pins 42. At this time, the arm part 54 of the process-liquid supply mechanism 5 is retracted to the retracted position in order that the arm part 54 interfere with the transfer operation of the wafer W. In addition, a downflow of purified air is continuously formed in the housing 31. After these operations, a liquid process is started in the liquid processing apparatus 3.

Figure 6A:
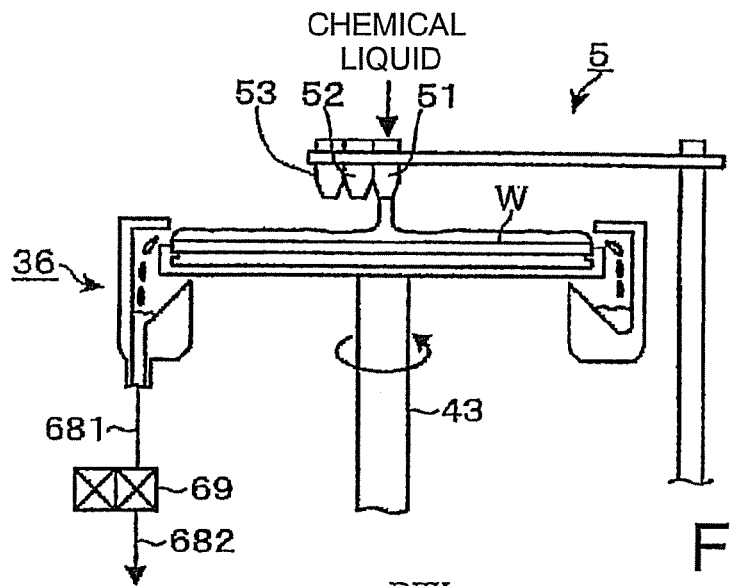
FIGS. 6A to 6C are explanatory views each showing an operation of the liquid processing apparatus.
Figure 6B:
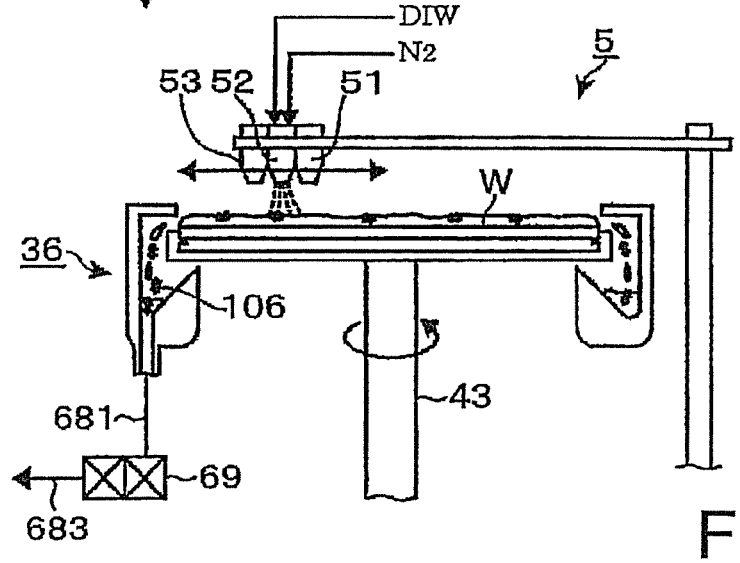
Figure 6C:
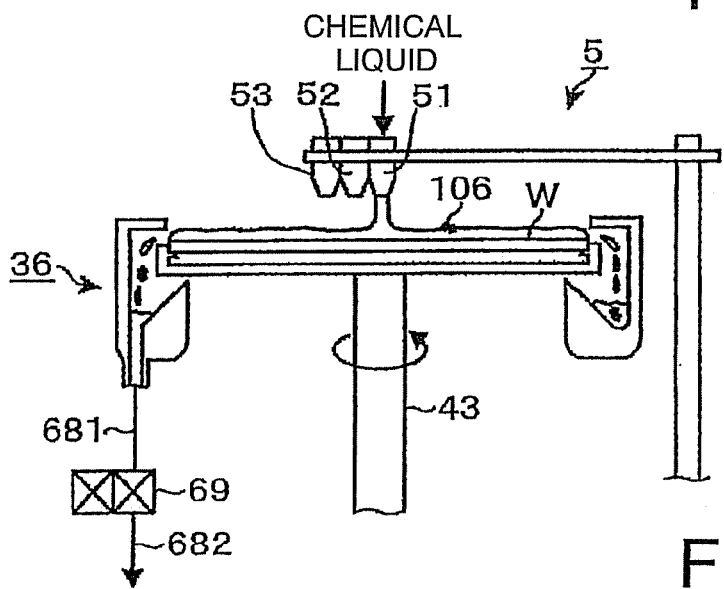

Herebelow, details of the liquid process performed in the liquid processing apparatus 3 are described with reference to FIGS. 6 to 9. FIGS. 6A to 6C are explanatory views each schematically showing an inside state of the liquid processing apparatus 3 during the liquid process. FIGS. 7A to 8C are explanatory views each schematically showing a condition of a part near to the surface of the wafer W during the liquid process. FIGS. 9(a) to 9(d) are time charts in which FIGS. 9(a) to 9(c) show operation states of the respective nozzles 51 to 53, and FIG. 9(d) shows destinations of a liquid to be discharged from the cup member 36.

Figure 7A:
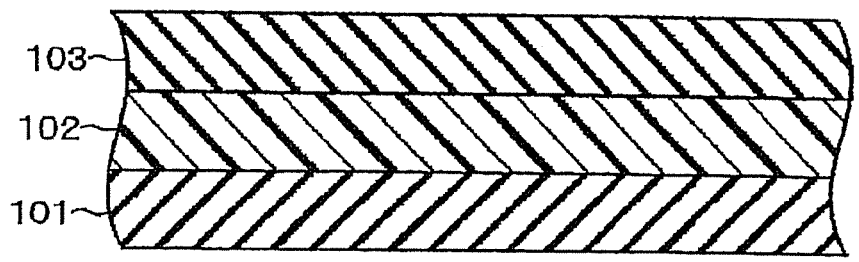
FIGS. 7A to 7D are first explanatory views each showing a state of a wafer surface, while the wafer is subjected to a liquid process by the liquid processing apparatus.

An actual state of the wafer W shown in FIG. 7A is the state shown in FIG. 1B. Namely, the trench 111 and the via hole 112 are formed in the interlayer dielectric film 101, and a via hole pattern is formed in the BARC 103 and the sacrifice film 102 by etching. However, in FIGS. 7 and 8, illustration of the pattern is omitted. In addition, when FIGS. 7 and 8 show the respective nozzles 51 and 52, only the nozzle 51 or 52 which is currently used is shown, and illustration of the other nozzles 51 to 53 is omitted. Also in FIG. 6, illustration of the housing 31, the bearing part 44, the base plate 300, and so on are suitably omitted.

When the wafer W shown in FIG. 7A is held by the wafer holding mechanism 4, the arm part 54 of the process-liquid supply mechanism 5 is turned such that, as shown in FIG. 6A, the chemical liquid nozzle 51 is moved to a position above a central part of the wafer W. On the other hand, the wafer W is rotated by the rotational shaft 43 about the vertical axis. As shown in FIG. 9(a), at a time point $T_1$, supply of the chemical liquid from the chemical liquid nozzle 51 is started.

Figure 7B:
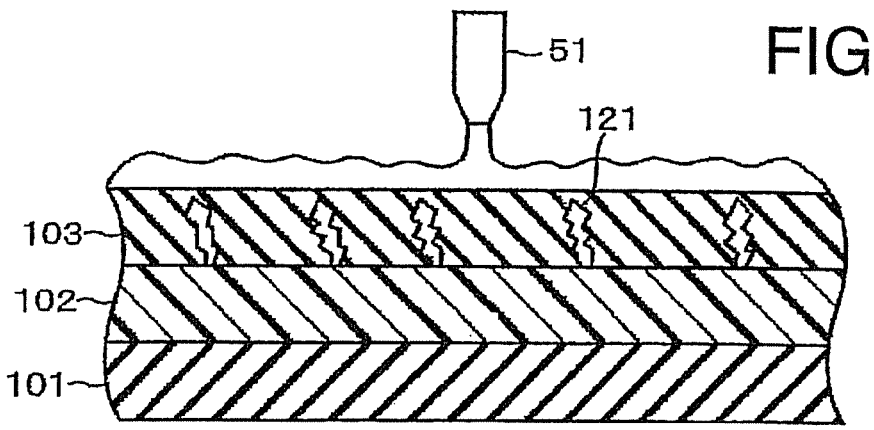
Figure 7C:
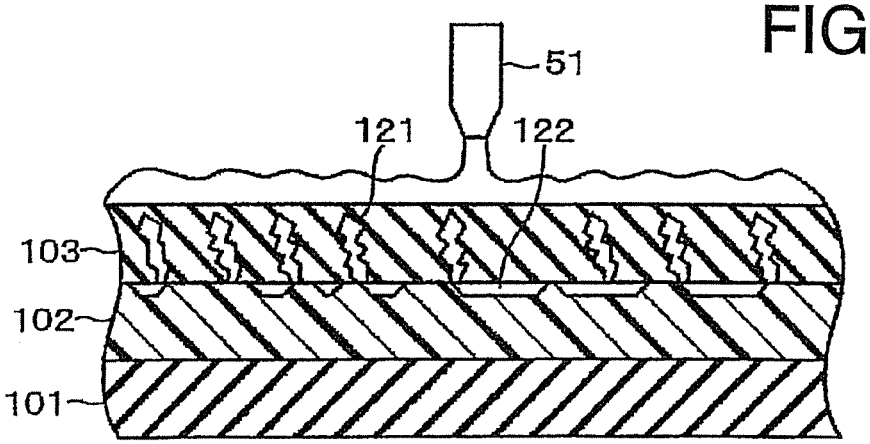

As described above, the chemical liquid in this embodiment is capable of, at least, permeating the BARC 103. Thus, as shown in FIG. 7B, the chemical liquid permeates the BARC 103 and swells the BARC 103, whereby cracks 121 are formed in the BARC 103. When the chemical liquid further permeates the BARC 103, the number of the cracks 121 increases, and the chemical liquid reaching the lower surface of the BARC 103 starts to dissolve the sacrifice film 102. Thus, liquid parts 122 are formed below the BARC 103 (FIG. 7C). Due to the formation of many cracks 121 and the liquid parts 122, a mechanical strength of the BARC 103 is weakened, i.e., the BARC 103 can be easily broken by an impact. Regarding a destination of the chemical liquid which is spun off from the rotating wafer W, the drainage line 681 is connected to the chemical-liquid collection line 682, whereby the chemical liquid is collected into the recycle tank 61 (FIG. 6A and FIG. 9($d$)).

Figure 7D:
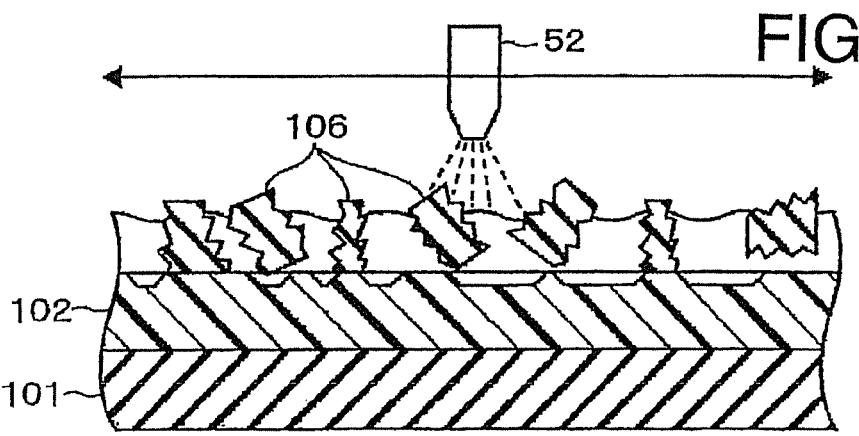

After the chemical liquid has been supplied for a predetermined period of time so that the mechanical strength of the BARC 103 is weakened, the supply of the chemical liquid from the chemical liquid nozzle 51 is stopped at a time point $T_2$. Thereafter, as shown in FIGS. 6B and FIG. 9($b$), a mixed fluid of DIW and nitrogen gas is discharged from the binary fluid spray nozzle 52, whereby an operation for breaking the BARC 103 is started. At this time, the wafer W is continuously rotated. In addition, impacts are uniformly given to the overall surface of the wafer W, by radially scanning the binary fluid spray nozzle 52 predetermined times between the center of the wafer W and the peripheral part thereof. Thus, as shown in FIG. 7D, the BARC 103 is broken into BARC pieces 106. These BARC pieces 106 can be washed away by the DIW flowing on the surface of the wafer W. In addition, the mixed fluid to be discharged from the binary fluid spray nozzle 52 is supplied to the substrate in an accelerated manner, as compared with the chemical liquid to be supplied from the chemical liquid nozzle 51.

As shown In FIG. 4, for example, a central rinse nozzle (central fluid supply part) 59 may be further provided, so as to supply a fluid such as a rinse liquid to the central area of the wafer W. For example, while the binary fluid spray nozzle 52 that radially scans the wafer W is distant from the central area of the wafer W, the central rinse nozzle 59 serves to supply a rinse liquid such as DIW to the central area. Thus, due to this structure, the BARC pieces 106 can be more effectively washed away, while the central area of the wafer W is prevented from drying. In addition, the rinse liquid from the central rinse nozzle 59 is used for washing away the BARC pieces 106. In FIG. 4, the central rinse nozzle 59 is connected to the DIW supply source 57 through a central rinse nozzle line 576. The reference number 577 depicts an opening/closing valve.

As shown in FIGS. 9($b$) and 9($d$), at the time point $T_2$ at which the discharge of the mixed fluid from the binary fluid spray nozzle 52 is started, the connection of the drainage line 681 is immediately switched, i.e., the drainage line 681 is connected to the discharge line 683, so that the DIW containing a large amount of BARC pieces 106 is not allowed to flow into the recycle tank 61. As a result, even when the chemical liquid is recycled, clogging of the filter 69 hardly occurs, to thereby decrease the exchange frequency of the filter 69.

After the operation for removing the BARC 103 has been performed for a predetermined period of time, the discharge of the mixed fluid from the chemical liquid nozzle 51 is stopped while the wafer W is rotated, and a rinse cleaning is performed (time point $T_3$ of FIG. 9($c$)). Thereafter, the chemical liquid nozzle 51 is moved to a position above the central part of the wafer W, and there is restarted supply of the chemical liquid onto the surface of the wafer W from which the BARC 103 has bee removed (FIG. 6C, and time point $T_4$ of FIG. 9($a$)).

Figure 8A:
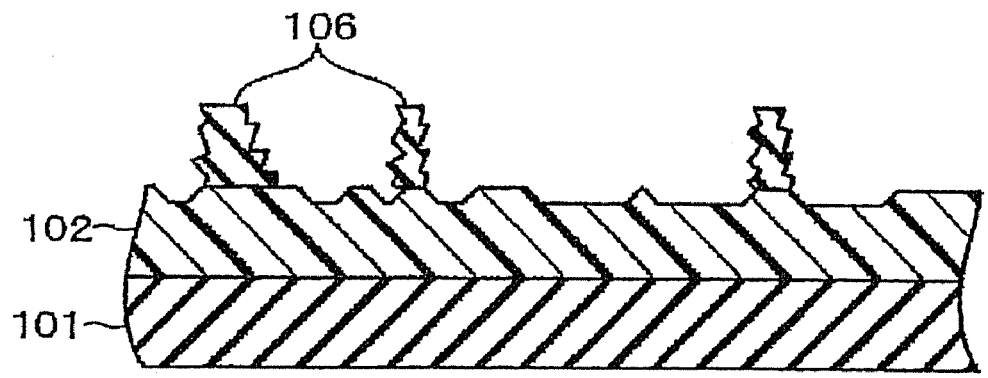
FIGS. 8A to 8C are second explanatory views each showing a state of the wafer surface, while the wafer is subjected to the liquid process by the liquid processing apparatus.
Figure 8B:
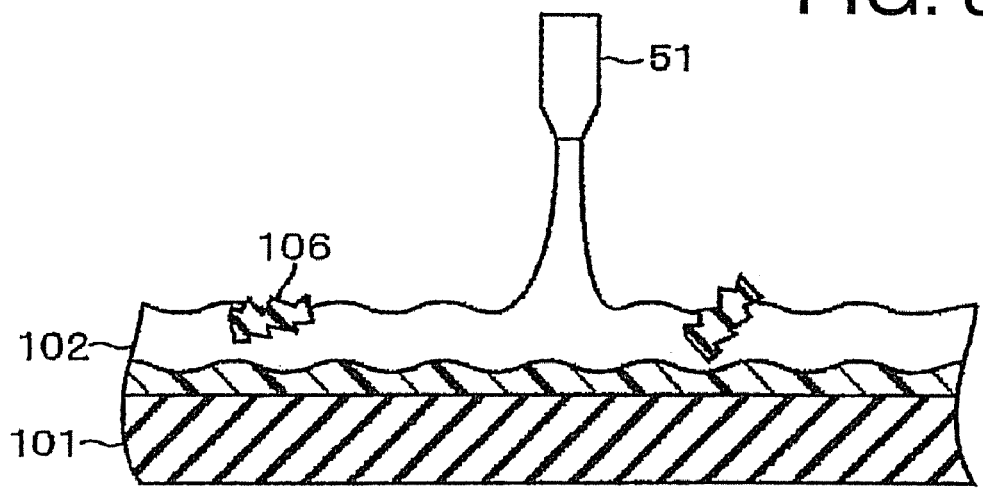
Figure 8C:
Figure 9:
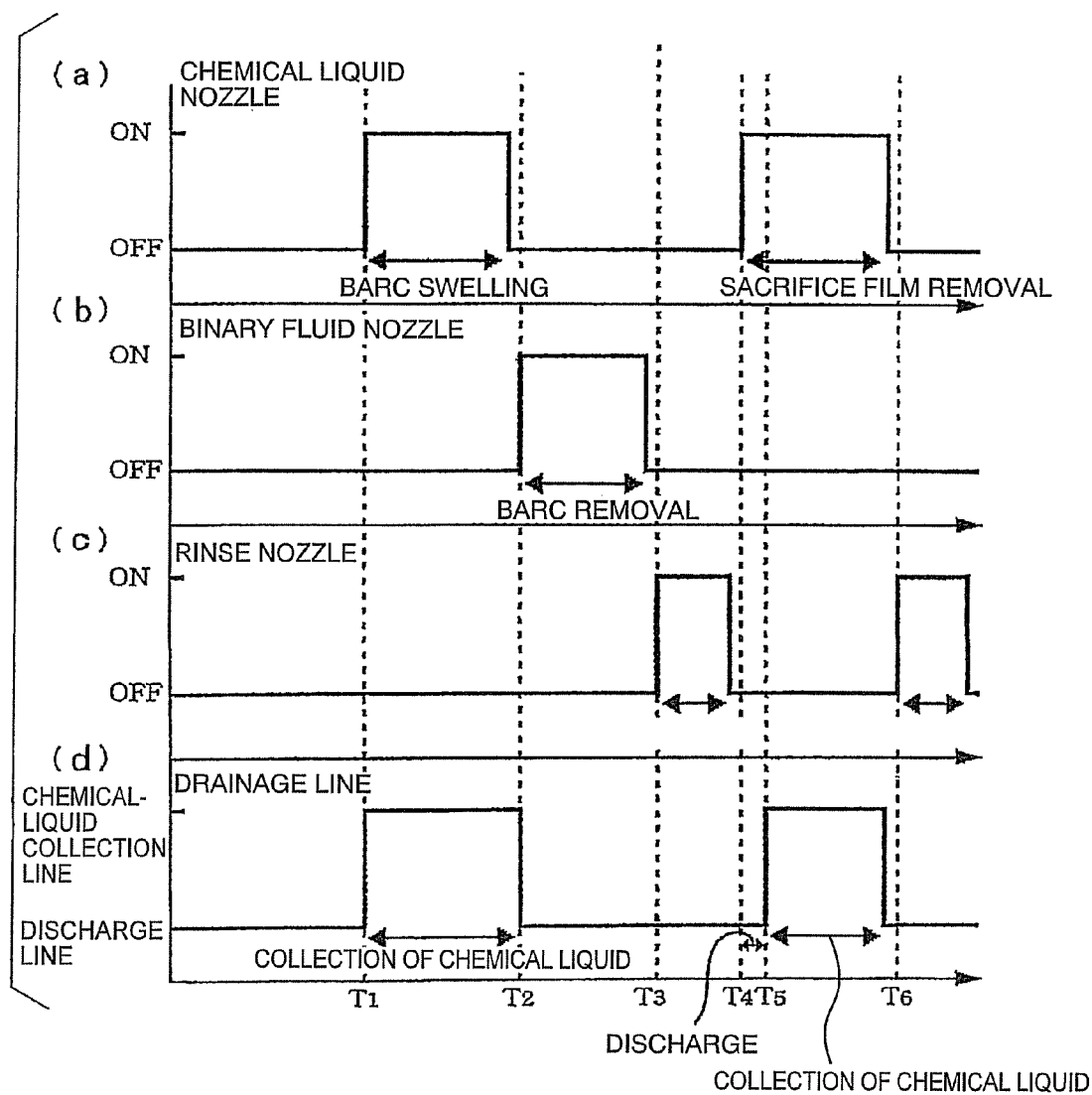
FIG. 9 is an explanatory view showing timings at which a chemical liquid is supplied to the liquid processing apparatus, and a timing at which a destination of a liquid to be discharged is switched.

As shown in FIG. 8A, for example, at this time, there is a possibility that 10% to 30% of the BARC pieces 106 in an area ratio of the wafer W might remain thereon. However, by means of the preceding operation for removing the BARC 103, the sacrifice film 102 is exposed to the wafer W. Thus, as shown in FIG. 8B, the sacrifice film 102 quickly dissolves by supplying thereto the chemical liquid. In accordance therewith, the remaining BARC pieces 106 are washed away together with the dissolved sacrifice film 102. Due to the above process, the sacrifice film 102 and the BARC pieces 106 remaining on the upper surface of the sacrifice film 102 are removed, whereby the wafer W having the exposed the interlayer dielectric film 101 can be obtained.

In the above operation, there is a possibility that, after the rinse cleaning, some BARC pieces are contained in the chemical liquid for a while from the start of the supply of the chemical liquid. Thus, the drainage line 381 is connected to the discharge line 683, so that the chemical liquid is discharged outside the liquid processing apparatus 3. After a predetermined period of time has passed, the connection of the drainage line 681 is switched, i.e., the drainage line 681 is connected to the chemical liquid collection line 682 at a time point $T_5$. Thus, an amount of the BARC pieces 106 flowing into the recycle tank 61 can be restrained, whereby a life duration of the filter 64 can be prolonged (FIG. 9($d$)). After the connection of the drainage line 681 switched, i.e., the drainage line 681 is connected to the chemical-liquid collection line 682, a part of the BARC pieces 106 may flow into the recycle tank 61. However, the inflow amount is greatly smaller, as compared with a case where the switching is not performed.

After the removal of the sacrifice film 102 and the BARC 103 has been removed, the supply of the chemical liquid from the chemical liquid nozzle 51 is stopped. As shown in FIGS. 9($c$) and 9($d$), at a time point $T_6$, the drainage line 681 is connected to the discharge line 683. Then, the rinse cleaning is performed, so that the liquid process is completed. After that, a spin drying of the wafer W is performed (an IPA (IsoPropyl Alcohol) supply nozzle may be provided on the process-liquid supply mechanism 5 so as to perform an IPA drying). Then, the wafer W is unloaded from the liquid processing apparatus 3 by transferring the wafer W from the wafer support part 451 to the pick of the external transfer mechanism by an operation reverse to the loading operation, and a series of operations are finished.

According to the liquid processing apparatus 3, the following effects can be produced. The chemical liquid is supplied to the BARC 103 (second film) formed above the sacrifice film 102 (first film), so that the chemical liquid serving as the second chemical liquid weakens the mechanical strength of the BARC 103. Then, the mixed fluid is discharged from the binary fluid spray nozzle 52 onto the surface of the wafer W to give impacts thereto. Thus, the BARC 103 is broken and the broken BARC 103 are removed. As a result, when the interlayer dielectric film 101 is subjected to the BEOL process, a film such as the BARC 103, which strongly adheres to the upper part of the patterned interlayer dielectric film 101, can be removed for a short period of time.

During a period when a lot of BARC pieces 106 are contained in the chemical liquid discharged from the liquid processing apparatus 3, since the destination of the discharged liquid is switched to the discharge line 683, the large amount of BARC pieces 106 is not allowed to flow into the recycle tank 61. Thus, even when the chemical liquid in the recycle tank 61 is reused, clogging of the filter 69 hardly occurs, to thereby decrease the exchange frequency of the filter 69.

In the above embodiment, the same chemical liquid is commonly used as the second chemical liquid for weakening the mechanical strength of the BARC 103 as the second film, and as the first chemical liquid for dissolving the sacrifice film 102 as the first film. However, there may be used two kinds of liquids, i.e., a liquid having a function for weakening the mechanical strength of the second film, and a liquid having a function for dissolving the first film.

Further, In the example described with reference to FIGS. 7 to 9, a cycle, which includes the step that weakens the mechanical strength of the BARC 103 by supplying thereto the chemical liquid, and the step that removes the BARC 103 by the mixed fluid discharged from the binary fluid spray nozzle 52, is performed only once. However, not limited thereto, this cycle may be performed two or more times.

Furthermore, physical impacts are given to the BARC 103 (second film) with the use of the binary fluid spray nozzle 52. However, not limited thereto, impacts may be given by jet nozzles that separately discharge a liquid such as DIW and a gas such as nitrogen gas. In addition to the spray nozzle 52 for giving impacts to the BARC 103, there may be provided a fluid nozzle exclusively used for washing away the BARC pieces 106. Moreover, a method of giving physical impacts to the BARC 103 is not limited to the method using a fluid, and a physical cleaning means such as a cleaning brush may be employed for giving impacts.

Additionally, in the above embodiment, as shown in FIG. 2, for example, the liquid processing apparatus 3 can rotate the wafer W while holding the same substantially horizontally. The liquid processing apparatus 3 can supply the chemical liquid onto the surface of the wafer W, and can uniformly give physical impacts to the overall surface of the wafer W by radially scanning the chemical liquid nozzle 51. However, the wafer W may not be necessarily rotated. For example, the chemical liquid nozzle 51 and the binary fluid spray nozzle 52 may be disposed above the wafer W that is horizontally held, such that the respective nozzles 51 and 52 can move in a lateral direction and a longitudinal direction in a place parallel to the wafer W. In this case, the chemical liquid can be supplied and physical impacts are given to the surface of the wafer W, by intermittently moving the wafer W or the nozzles 51 and 52 in the longitudinal direction, and simultaneously therewith, by reciprocating these nozzles in the lateral direction to linearly scan the surface of the wafer W, so as to uniformly scan the overall surface of the wafer W with a single stroke.

In addition to the above examples, the second film may be a hardened layer such as a resist film. In a case where the BARC is a TARC as the second film formed above the resist film, the resist film or a sacrifice film formed below the TARC serve as the first film. Moreover, a material of the interlayer dielectric film is not limited to the low-k material. For example, a pattern may be formed in a polysilicon film or an $SiO_2$ film. In this case, the present can be applied to a case where the first chemical liquid less capable of dissolving a BARC and a resist hardening layer in order to protect the pattern.

The invention claimed is:

1. A liquid processing method for removing a first film and a second film from a substrate including the first film that is dissolved by a first chemical liquid, and the second film formed above the first film, the liquid processing method comprising:

supplying a second chemical liquid to the substrate for weakening a strength of the second film;

stopping the supply of the second chemical liquid;

thereafter, breaking the second film, the strength of which has been weakened, by giving a physical impact to the second film;

removing the second film by means of a fluid, by supplying the fluid to the substrate so as to wash away debris of the second film to which the physical impact has been given; and dissolving and removing the first film by supplying the first chemical liquid to the substrate from which the second film has been removed and on which the first film has been retained, wherein each of the first chemical liquid and the second chemical liquid consists of an amine-based release agent and the fluid comprises a gas-liquid mixture.

2. The liquid processing method according to claim 1, wherein when at least one of the first chemical liquid, the second chemical liquid, and the fluid for giving the physical impact is supplied to the substrate, the substrate is rotated while the substrate is held substantially horizontally.

3. The liquid processing method according to claim 1, comprising switching of destinations of at least one of the first chemical liquid, the second chemical liquid and the fluid that has been supplied to the substrate, such that one of the first chemical liquid and the second chemical liquid supplied to the substrate is allowed to flow to a chemical-liquid collection line, and the fluid containing debris of the second film is allowed to flow to a discharge line.

4. The liquid processing method according to claim 1, wherein the liquid processing method removes the first film and the second film from a surface of the substrate in which the first film and the second film are formed above a low-k material.

5. The liquid processing method according to claim 1, wherein the first film is a resist film and/or a film formed below the resist film that smoothen irregularities of a surface of the substrate so as to flatten a surface of the resist film, and the second film is an antireflection film for restraining incident light upon exposure of the resist film and/or a hardening layer formed of a material constituting the resist film that has been chemically changed.

6. The liquid processing method according to claim 1, wherein breaking of the second film and the removing of the second film are simultaneously performed by the fluid.

7. The liquid processing method according to claim 1, wherein when the second film is broken, the fluid is radially scanned between a central part of the substrate and a peripheral part thereof.

8. The liquid processing method according to claim 3, wherein destinations of the first chemical liquid is switched such that, after the first chemical liquid has been supplied to the substrate, the first chemical liquid is allowed to flow to the discharge line for a predetermined period of time, and that the first chemical liquid is then allowed to flow to the chemical-liquid collection line.

9. The liquid processing method according to claim 6, wherein the fluid is supplied to the substrate in an accelerated manner.

10. The liquid processing method according to claim 7, wherein when the second film is broken, the fluid is supplied to the central part of the substrate.

11. A storage medium storing a computer program executable on a computer, which is used in a liquid processing method for removing a first film and a second film from a substrate including the first film that is dissolved by a first chemical liquid, and the second film formed above the first film, the liquid processing method comprising:

supplying a second chemical liquid to the substrate for weakening a strength of the second film;

stopping the supply of the second chemical liquid;

thereafter, breaking the second film, the strength of which has been weakened, by giving a physical impact to the second film;

removing the second film by means of a fluid, by supplying the fluid to the substrate so as to wash away debris of the second film to which the physical impact has been given; and dissolving and removing the first film by supplying the first chemical liquid to the substrate from which the second film has been removed and on which the first film has been retained, wherein each of the first chemical liquid and the second chemical liquid consists of an amine-based release agent and the fluid comprises a gas-liquid mixture.

* * * * *